(12) United States Patent
Hu et al.

(10) Patent No.: US 9,461,062 B1
(45) Date of Patent: Oct. 4, 2016

(54) SEMICONDUCTOR DEVICE AND MANUFACTURING METHOD THEREOF

(71) Applicant: MACRONIX INTERNATIONAL CO., LTD., Hsinchu (TW)

(72) Inventors: Chih-Wei Hu, Miaoli County (TW); Teng-Hao Yeh, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 14/700,253

(22) Filed: Apr. 30, 2015

(51) Int. Cl.
*H01L 27/115* (2006.01)
*H01L 23/535* (2006.01)

(52) U.S. Cl.
CPC ....... *H01L 27/11582* (2013.01); *H01L 23/535* (2013.01); *H01L 27/11568* (2013.01)

(58) Field of Classification Search
CPC ............... H01L 27/11582; H01L 27/11568; H01L 23/535
See application file for complete search history.

(56) References Cited

U.S. PATENT DOCUMENTS

| | | | | |
|---|---|---|---|---|
| 8,625,348 B2* | 1/2014 | Lee | ................... | G11C 16/0483 365/185.05 |
| 9,070,587 B2* | 6/2015 | Hwang | .............. | H01L 27/11551 |
| 2010/0078701 A1* | 4/2010 | Shim | ................. | H01L 27/11521 257/314 |
| 2014/0227842 A1 | 8/2014 | Lee et al. | | |
| 2015/0054058 A1* | 2/2015 | Seol | .................. | H01L 29/42332 257/324 |
| 2015/0076580 A1* | 3/2015 | Pachamuthu | ..... | H01L 27/11551 257/314 |
| 2015/0076668 A1 | 3/2015 | Shih et al. | | |
| 2015/0166942 A1* | 6/2015 | Kang | ................. | C11D 11/0047 438/479 |

OTHER PUBLICATIONS

TIPO Office Action dated May 19, 2016 in Taiwan application (No. 104114221).

* cited by examiner

*Primary Examiner* — William Coleman
(74) *Attorney, Agent, or Firm* — McClure, Qualey & Rodack, LLP

(57) ABSTRACT

A semiconductor device including a substrate, a bottom insulating layer disposed on the substrate, two stacked structure disposed on the bottom insulating layer, a charge trapping structure, and a channel layer disposed on the charge trapping structure is provided. Each of the stacked structures includes a plurality of semiconductor layers and insulating layers, a top insulating layer disposed on the semiconductor layers and the insulating layers, and a high-doped semiconductor layer disposed on the top insulating layer. The semiconductor layers and the insulating layers are alternately stacked on the bottom insulating layer. The charge trapping layer is disposed on a lateral surface of each of the stacked structures and a top surface of the bottom insulating layer. The channel layer is directly contacted the high-doped semiconductor layer.

18 Claims, 10 Drawing Sheets

SEMICONDUCTOR DEVICE AND MANUFACTURING METHOD THEREOF

TECHNICAL FIELD

The disclosure relates in general to a semiconductor device and a manufacturing method thereof, and more particularly to a vertical channel semiconductor device and a manufacturing method thereof.

BACKGROUND

Memory devices are used in storage elements for many products, such as MP3 players, digital cameras, computer files, etc. As the application increases, the demand for the memory device focuses on small size and large memory capacity.

As such, it is desirable to develop a vertical channel memory to achieve greater storage capacity, a small size, and yet having excellent property and stability. However, a thin polysilicon is used as a channel layer in the vertical channel memory in general, which cannot avoid the contact landing risk and may bring an overlap issue because of the extra lithography process.

SUMMARY

The disclosure is directed to a semiconductor device and a manufacturing method thereof. Part of a charge trapping structure is etched and then a high-doped semiconductor layer is deposited to form a thick landing pad for stably connecting with a conductive plug.

According to one embodiment, a semiconductor device including a substrate, a bottom insulating layer disposed on the substrate, two stacked structure disposed on the bottom insulating layer, a charge trapping structure, and a channel layer disposed on the charge trapping structure is provided. Each of the stacked structures includes a plurality of semiconductor layers and insulating layers, a top insulating layer disposed on the semiconductor layers and the insulating layers, and a high-doped semiconductor layer disposed on the top insulating layer. The semiconductor layers and the insulating layers are alternately stacked on the bottom insulating layer. The charge trapping layer is disposed on a lateral surface of each of the stacked structures and a top surface of the bottom insulating layer. The channel layer is directly contacted the high-doped semiconductor layer.

According to another embodiment, a manufacturing method of a semiconductor device is provided. The manufacturing method includes the following steps. A bottom insulating layer is formed on a substrate. A plurality of semiconductor layers and insulating layers are alternately stacked on the bottom insulating layer. A top insulating layer and a silicon nitride layer are formed on the semiconductor layers and the insulating layers to form a plurality of stacked structures. A charge trapping structure and a channel layer are sequentially deposited on surfaces of the stacked structures and a portion of a top surface of the bottom insulating layer. Part of the channel layer is removed to expose a top surface of the charge trapping structure. The charge trapping structure on the silicon nitride layer is removed. The silicon nitride layer is removed. A high-doped semiconductor layer is deposited on each of the stacked structures, wherein the high-doped semiconductor layer is directly in contact with the channel layer. An etching process is implemented to separate the high-doped semiconductor layer on each of the stacked structures.

Figure 1:
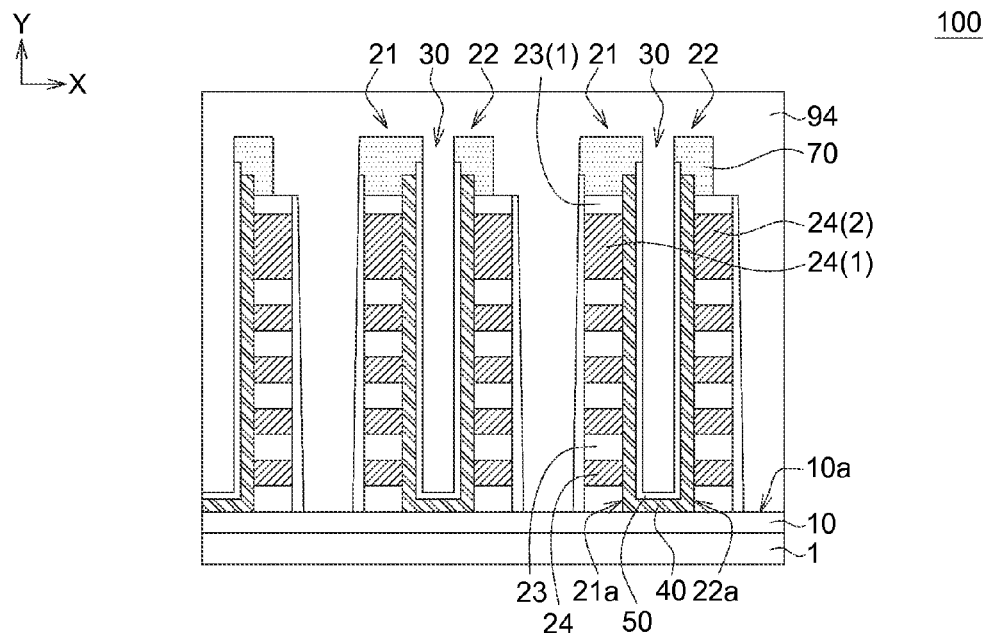
FIG. 1 illustrates a cross-section view of the semiconductor device in one embodiment according to the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

The embodiments are described in details with reference to the accompanying drawings. The identical elements of the embodiments are designated with the same reference numerals. Also, it is important to point out that the illustrations may not be necessarily drawn to scale, and that there may be other embodiments of the present disclosure which are not specifically illustrated. Thus, the specification and the drawings are regard as an illustrative sense rather than a restrictive sense.

FIG. 1 illustrates a cross-section view of the semiconductor device 100 in one embodiment according to the disclosure. It should be noted that FIG. 1 is only a partial schematic diagram of the semiconductor device 100, and some elements of the semiconductor device 100 may be omitted in FIG. 1. As shown in FIG. 1, the semiconductor device 100 includes a substrate 1, a bottom insulating layer 10, two stacked structures 21 and 22, a charge trapping structure 40, and a channel layer 50. The bottom insulating layer 10 is disposed on the substrate 1. The stacked structures 21 and 22 are disposed on the bottom insulating layer 10. The charge trapping structure 40 are disposed on the lateral surface 21a of the stacked structure 21, the lateral surface 22a of the stacked structure 22 and a portion of the top surface 10a of the bottom insulating layer 10. The channel layer 50 is disposed on the charge trapping structure 40.

In this embodiment, the stacked structure 21 includes a plurality of semiconductor layers 24 and insulating layers 23 alternately stacked on the bottom insulating layer 10, a top insulating layer 23(1) disposed on the semiconductor layers 24 and the insulating layers 23, and a high-doped semiconductor layer 70 disposed on the top insulating layer 23(1). Besides, the channel layer 50 may be directly in contact with the high-doped semiconductor layer 70.

As shown in FIG. 1, the top of the channel layer 50 is higher than the top of the charge trapping structure 40. The high-doped semiconductor layer 70 may also be directly in contact with the charge trapping structure 40, and the top of the high-doped semiconductor layer 70 is higher than the top of the channel layer 50 and the top of the charge trapping structure 40. Further, the thickness of the high-doped semiconductor layer 70 is larger than the thickness of the channel layer 50.

In the embodiment according to the disclosure, the charge trapping structure 40 may be a multi-layer structure and include a plurality of first dielectric layers and second dielectric layers (not shown in FIG. 1). For example, the charge trapping structure 40 may be a silicon oxide/silicon nitride/silicon oxide (ONO) structure or a silicon oxide/ silicon nitride/silicon oxide/silicon nitride/silicon oxide (ONONO) structure. That is, the material of each of the first dielectric layers may be silicon nitride, and the material of each of the second dielectric layers may be silicon oxide. However, the disclosure is not limited thereto.

Besides, the heights of the first dielectric layers and the heights of the second dielectric layers may be different because of the manufacturing method, which will be described in the following detailed description.

In the embodiment according to the disclosure, the material of the channel layer 50 and the material of the high-doped semiconductor layer 70 may be the same. For example, the material of the high-doped semiconductor layer 70 and the channel layer 50 may be N type doping polysilicon, while the material of each of the semiconductor layers 24 may be P type doping polysilicon. However, the disclosure is not limited thereto.

In the embodiment according to the disclosure, the stacked structure 22 may have a structure similar to the stacked structure 21, and will not be narrated herein. As shown in FIG. 1, the charge trapping structure 40 and the channel layer 50 may be formed in the trench 30 between the stacked structure 21 and the stacked structure 22, and the charge trapping structure 40 and the channel layer 50 may be U-shaped. Besides, after forming the charge trapping structure 40 and the channel layer 50, the trench 30 may be filled by the oxide 94.

In one embodiment, the topmost semiconductor layer 24(1) of the stacked structure 21 may be a ground select line (GSL) and the topmost semiconductor layer 24(2) of the stacked structure 22 may be a string select line (SSL). Besides, the semiconductor device 100 may include a plurality of stacked structures 21 and stacked structures 22, and the plurality of stacked structures 21 and stacked structures 22 may be isolated by the oxide 94.

Figure 2:
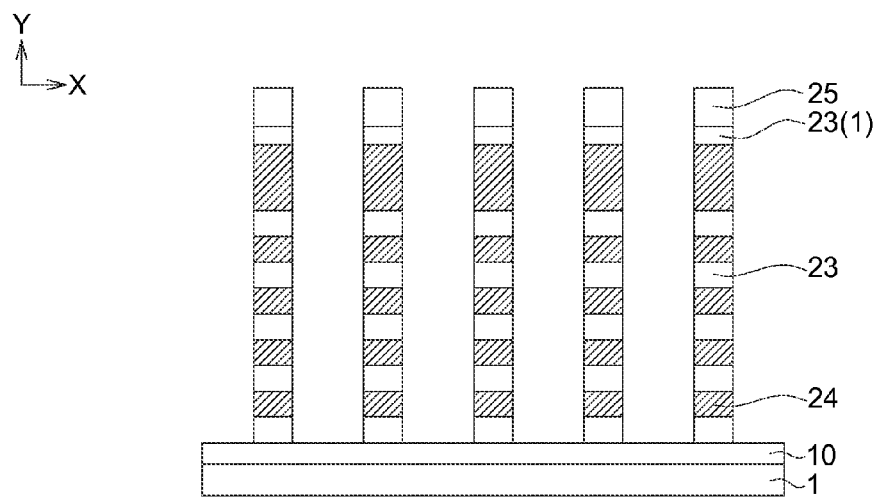
FIG. 2 to FIG. 14B illustrate a process for manufacturing the semiconductor device in one embodiment according to the disclosure.

FIG. 2 to FIG. 14B illustrate a process for manufacturing the semiconductor device 100 in one embodiment according to the disclosure. First, a bottom insulating layer 10 is formed on a substrate 1. Then, a plurality of semiconductor layers 24 and insulating layers 23 are formed on the bottom insulating layer 10, and a top insulating layer 23(1) and a silicon nitride layer 25 are formed on the semiconductor layers 24 and the insulating layers 23, such that a plurality of stacked structures are formed as shown in FIG. 2.

In this embodiment, the insulating layers 23 and the top insulating layer 23(1) may be such as silicon oxide layers. The silicon nitride layer 25 is disposed on the top insulating layer 23(1) to stabilize each of the stacked structures, since the silicon nitride layer 25 has larger tensile stress.

Figure 3:
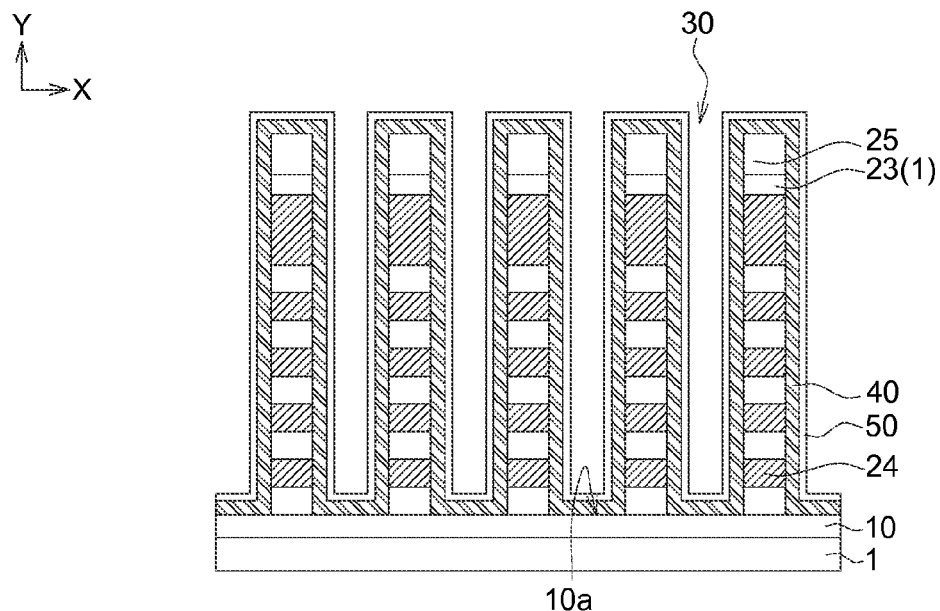

As shown in FIG. 3, a charge trapping structure 40 and a channel layer 50 are sequentially formed on the surfaces of the stacked structures and part of the top surface 10a of the bottom insulating layer 10. In this embodiment, the charge trapping structure 40 may be such as a multi-layer structure and include a first dielectric layer and a second dielectric layer. For example, the charge trapping structure 40 may be a silicon oxide/silicon nitride/silicon oxide (ONO) structure or a silicon oxide/silicon nitride/silicon oxide/silicon nitride/silicon oxide (ONONO) structure. That is, the material of each of the first dielectric layers may be silicon nitride, and the material of each of the second dielectric layers may be silicon oxide. The thickness of the channel layer 50 may be such as 8 nm. Here, a plurality of trenches 30 may be between the stacked structures.

Figure 4:
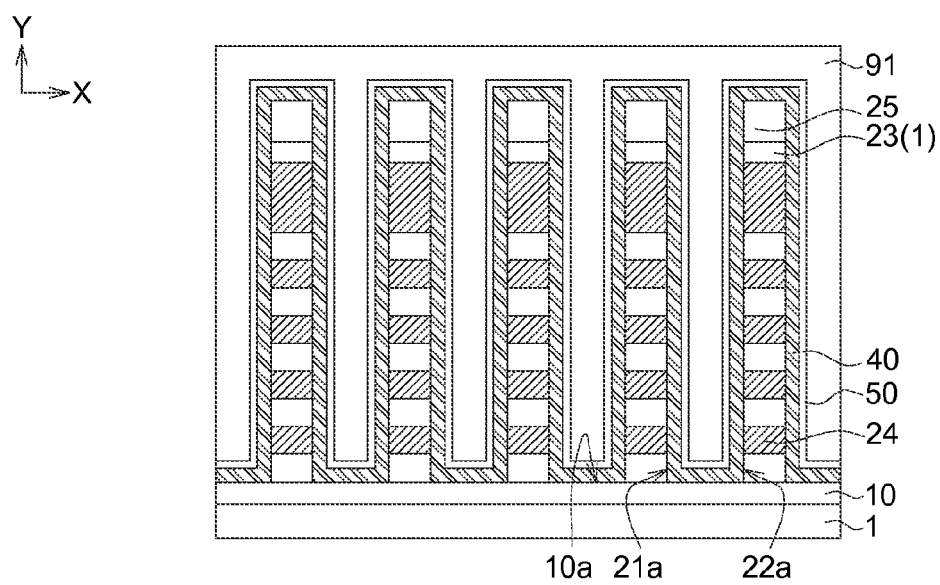
Figure 5:
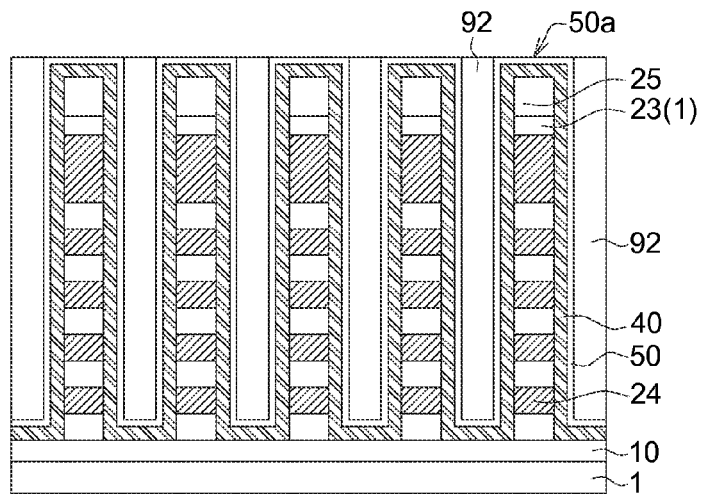

As shown in FIG. 4, the oxide 91 is filled, such that the remained portion of the trench 30 is filled by the oxide 91. Then, the oxide 91 on the top surface 50a of the channel layer 50 is removed, and the oxide 92 is formed as shown in FIG. 5. For example, an etching tool may be used or a chemical mechanic polish (CMP) process may be implemented, and the channel layer 50 may be used as a stop layer.

Figure 6:
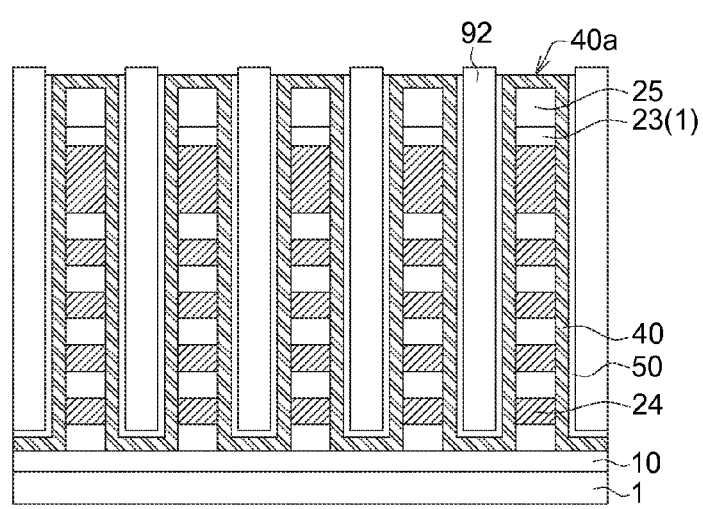
Figure 7:
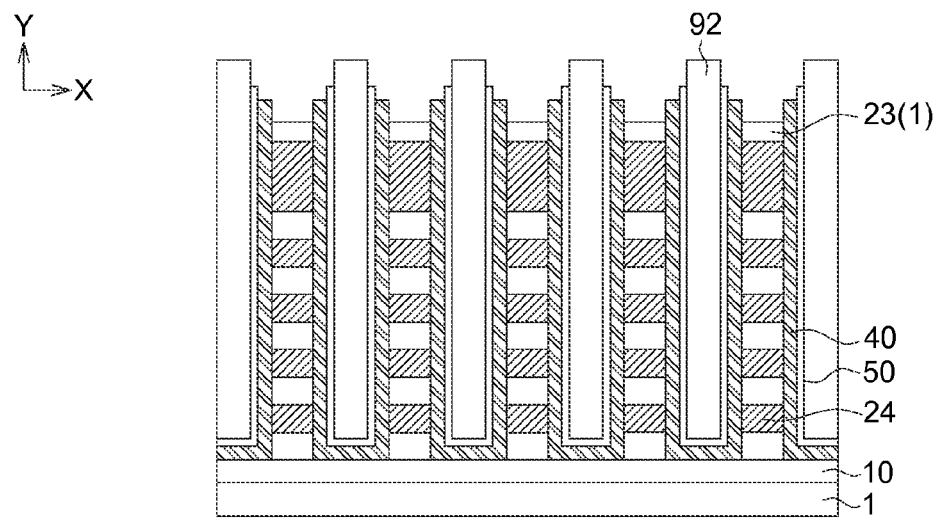

As shown in FIG. 6, part of the channel layer 50 is removed to expose the top surface 40a of the charge trapping structure 40. Then, the charge trapping structure 40 on the silicon nitride layer 25 and the silicon nitride layer 25 are sequentially removed as shown in FIG. 7.

For example, the charge trapping structure 40 on the silicon nitride layer 25 may be removed by the etching tool, and part of the channel layer 50 may also be removed at the same time. Then, the silicon nitride layer 25 may be removed by phosphoric acid ($H_3PO_4$). The phosphoric acid may have much higher selectivity to oxide; therefore, the silicon nitride layer 25 may be removed, while the top insulating layer 23(1) may be remained. That is, the silicon nitride layer 25 may be used as a sacrificial layer, and the stacked structures may be self-aligned on the top surface of the top insulating layer 23(1) after removing the silicon nitride layer 25.

Besides, since the charge trapping structure 40 may include the first dielectric layer formed of silicon nitride and the second dielectric layer formed of silicon oxide, part of the first dielectric layer may be removed, while the second dielectric layer may be remained. That is, the height of the first dielectric layer and the height of the second dielectric layer may be different (not shown in FIG. 7).

Figure 8:
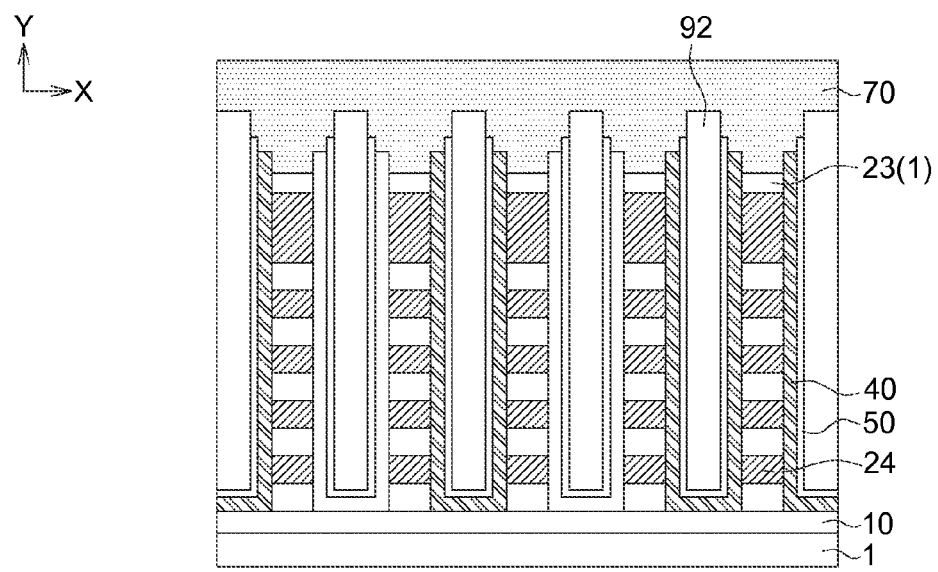

As shown in FIG. 8, a high-doped semiconductor layer 70 is deposited on the stacked structures, and the high-doped semiconductor layer 70 are directly in contact with the channel layer 50 and the top insulating layer 23(1). Here, the high-doped semiconductor layer 70 may be N type doping polysilicon.

Figure 9:
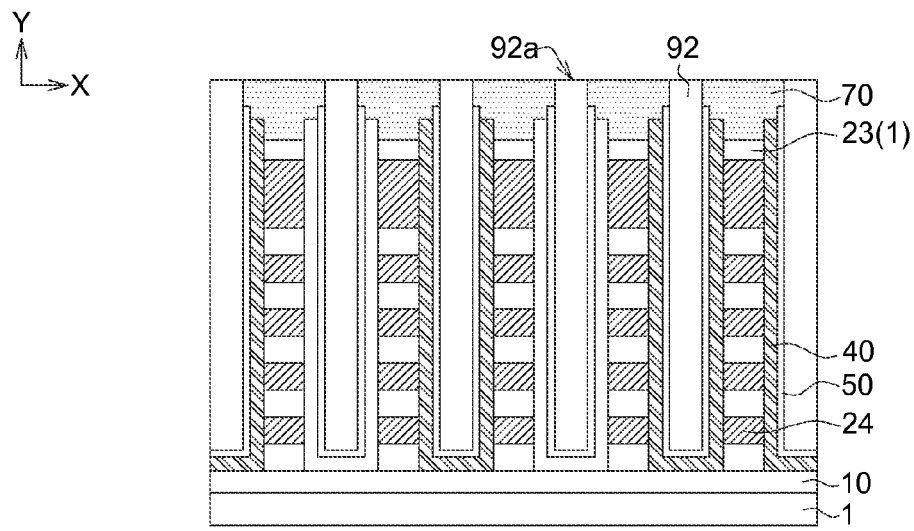

As shown in FIG. 9, part of the high-doped semiconductor layer 70 is removed to expose the top surface 92a of the oxide 92. Similarly, an etching tool may be used or a chemical mechanic polish (CMP) process may be implemented to remove part of the high-doped semiconductor layer 70.

Figure 10A:
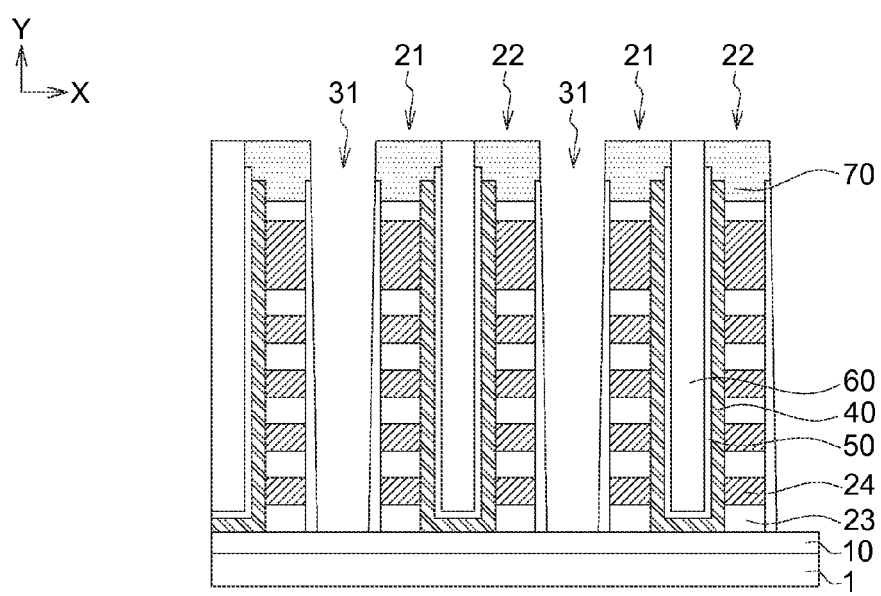
Figure 10B:
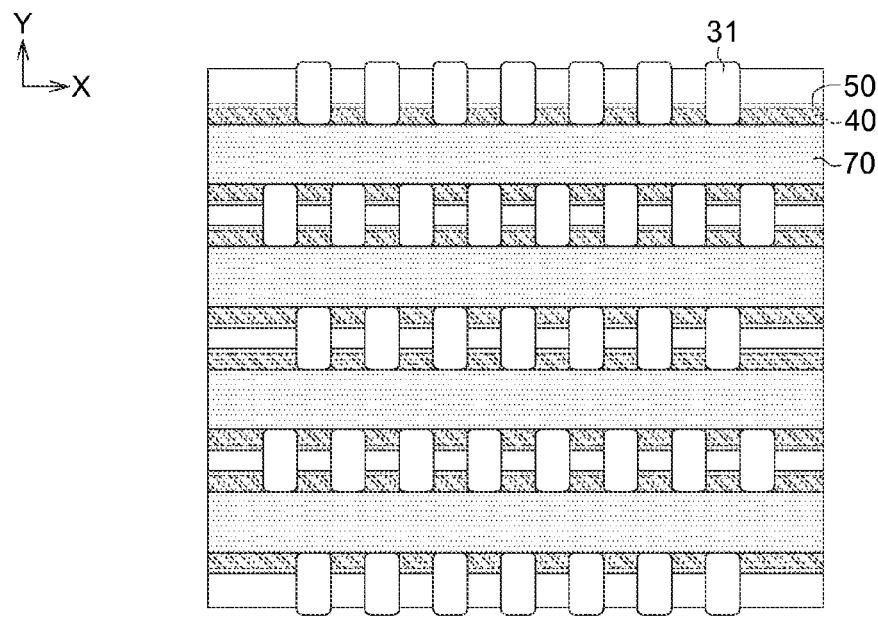
Figure 10C:
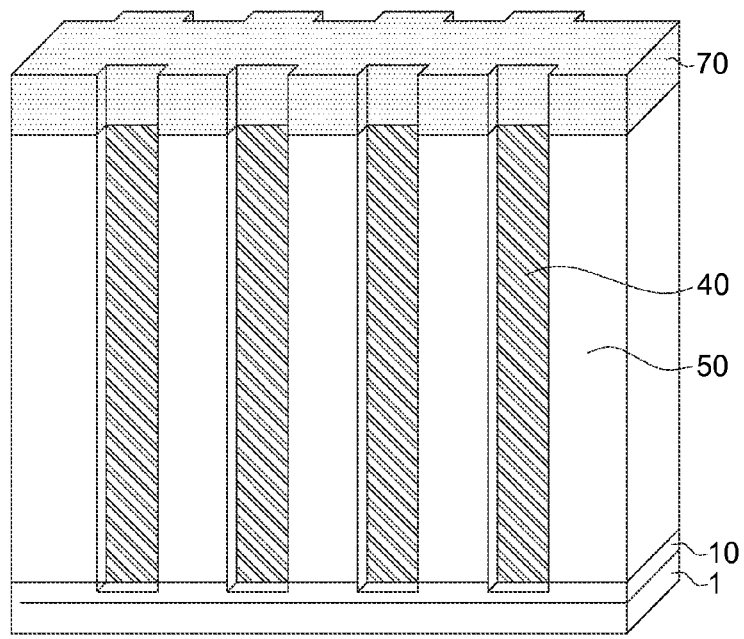

As shown in FIG. 10A to FIG. 10C, an etching process may be implemented to form a plurality of trenches 31 and stacked structures 21, 22, such that the charge trapping structure 40 and the channel layer 50 between the stacked structure 21 and the stacked structure 22 may be U-shaped. Then, oxide is filled in the trenches 31 and the plurality of the stacked structures 21 and 22 may be separated. Here, FIG. 10A is a cross-section view of the stacked structures in this stage, FIG. 10B is a top view of the stacked structures in this stage, and FIG. 100 is a 3D schematic diagram of the stacked structures in this stage.

Figure 11:
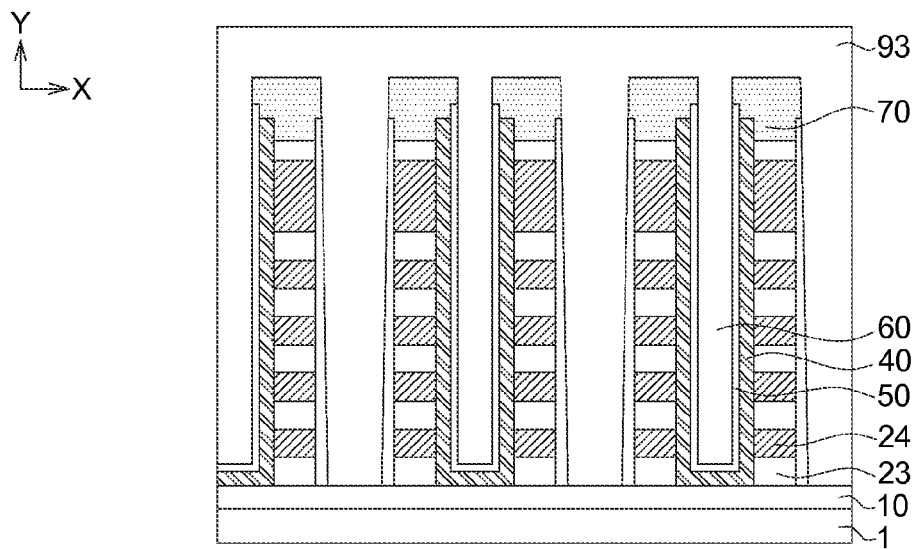

Then, oxide 93 is deposited in the trenches 31 and the top surface of the high-doped semiconductor layer 70 to form the structure as illustrated in FIG. 11.

Figure 12A:
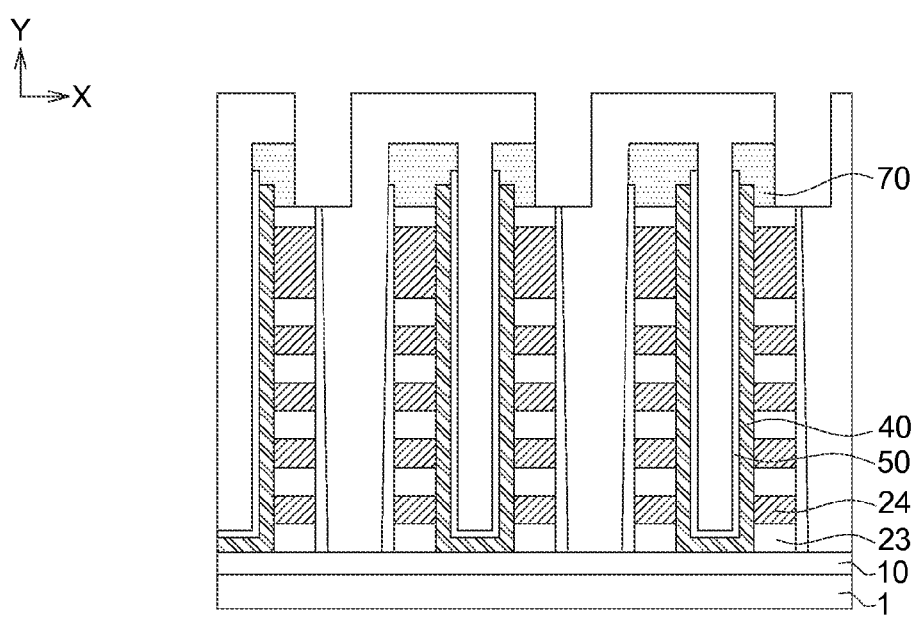
Figure 12B:
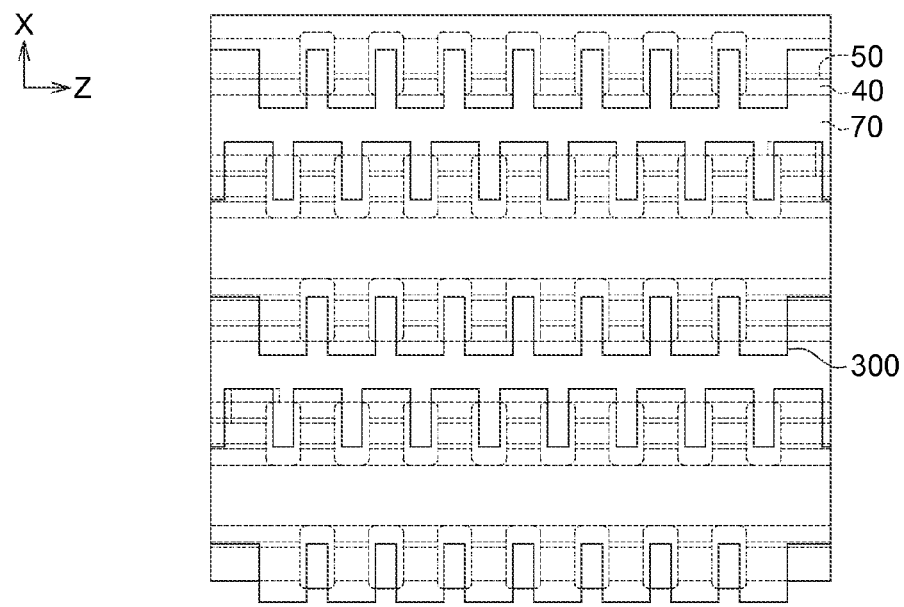
Figure 12C:
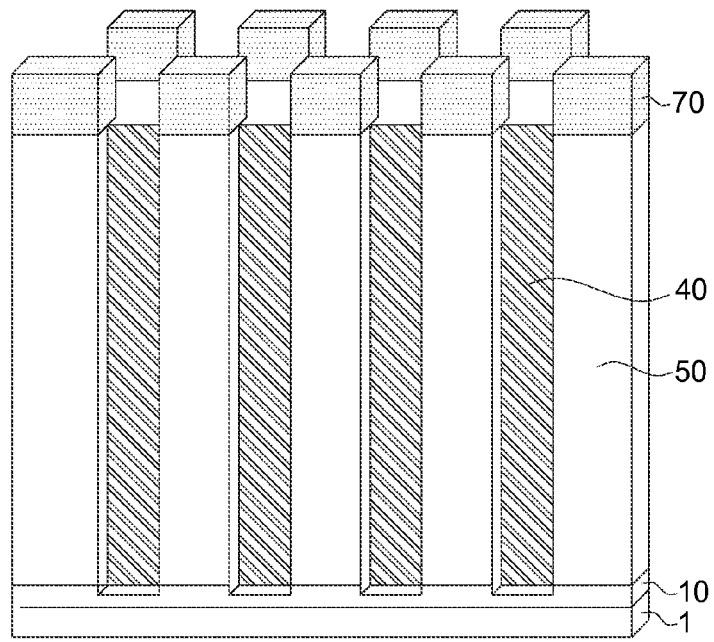

Then, as shown in FIG. 12 A to FIG. 12C, an etching process is implemented by the mask 300 to separate the high-doped semiconductor layer 70 on each of the stacked structures 21 and stacked structures 22. Here, FIG. 12A is a cross-section view of the stacked structures in this stage, FIG. 12B is a top view of the stacked structures in this stage, and FIG. 12C is a 3D schematic diagram of the stacked structures in this stage.

Finally, oxide 94 is formed on the top of the separated high-doped semiconductor layers 70 and between the separated high-doped semiconductor layers 70, such that the semiconductor device 100 as shown in FIG. 1 is formed.

In the embodiment according to the disclosure, the semiconductor device 100 may further include a conductive plug 80 disposed on the high-doped semiconductor layer 70 for electrically connecting to the high-doped semiconductor layer 70 and the channel layer 50.

Figure 13:
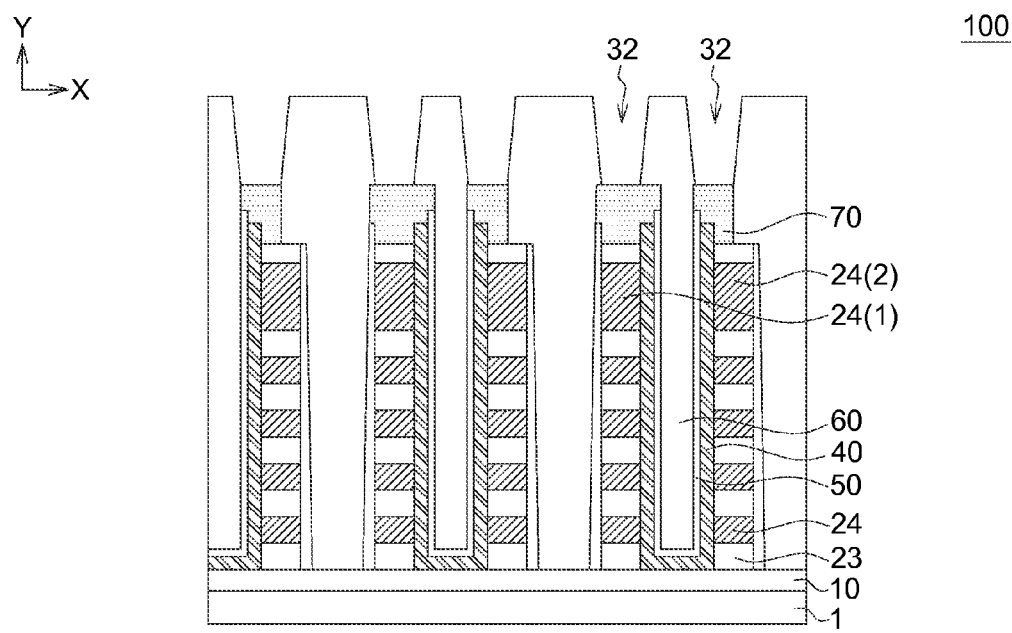
Figure 14A:
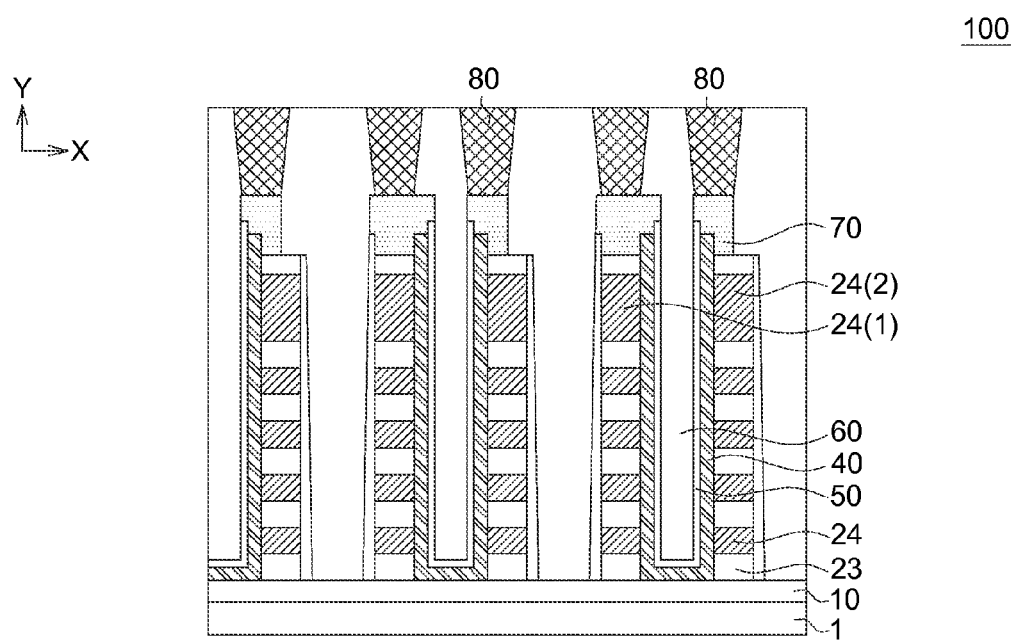
Figure 14B:
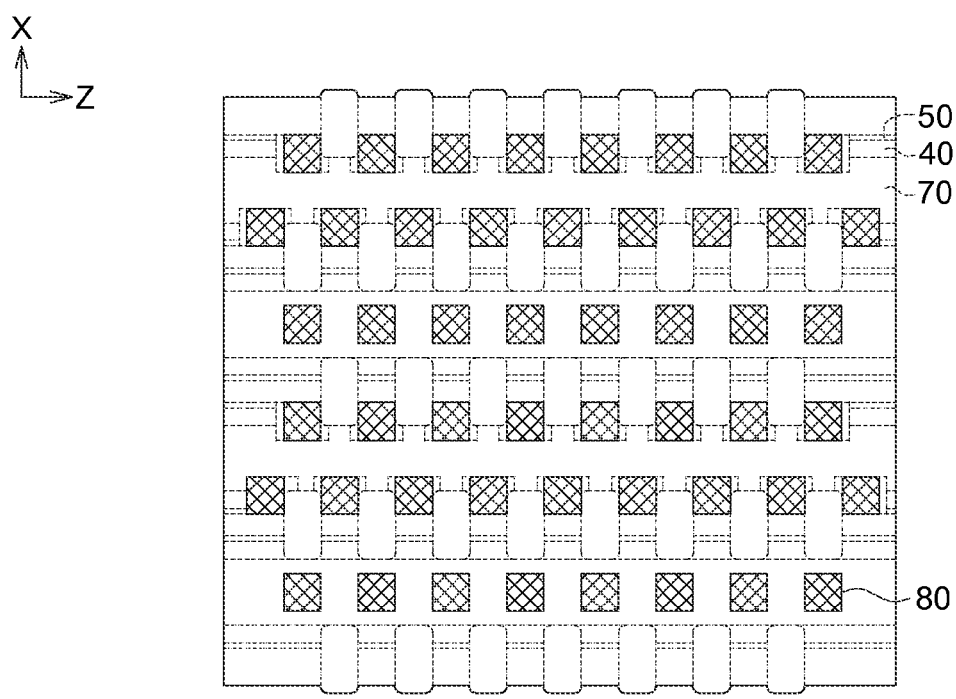

FIG. 13 to FIG. 14B illustrate a process for forming the conductive plug 80 on the high-doped semiconductor layer 70 in one embodiment according to the disclosure. As shown in FIG. 13, a plurality of through holes 32 is formed. The through holes may expose the top surface of the high-doped semiconductor layer 70.

Then, conductive material is filled in the through holes 32 to form a plurality of conductive plugs 80. It should be noted that the positions of the conductive plugs 80 are not limited to the positions as shown in FIG. 14A and FIG. 14B.

The semiconductor device 100 in the embodiment according to the disclosure is a vertical gate structure, and may be applied in such as a NAND flash. The high-doped semiconductor layers 70 formed by the manufacturing method according to the disclosure may be self-aligned, and an extra lithography process is not needed. Further, the semiconductor device and the manufacturing method of the semiconductor device according to the disclosure may effectively avoid the contact landing risk and the overlap issue.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A semiconductor device, comprising:
   a substrate;
   a bottom insulating layer disposed on the substrate;
   two stacked structures disposed on the bottom insulating layer, each of the stacked structures comprising:
   a plurality of semiconductor layers and insulating layers alternately stacked on the bottom insulating layer;
   a top insulating layer disposed on the semiconductor layers and the insulating layers; and
   a high-doped semiconductor layer disposed on the top insulating layer;
   a charge trapping structure disposed on a lateral surface of each of the stacked structures and a top surface of the bottom insulating layer; and
   a channel layer disposed on the charge trapping structure and directly in contact with the high-doped semiconductor layer;
   wherein the high-doped semiconductor layer is directly in contact with the charge trapping structure, and a top of the high-doped semiconductor layer is higher than a top of the channel layer and a top of the charge trapping structure.

2. The semiconductor device according to claim 1, wherein the top of the channel layer is higher than the top of the charge trapping structure.

3. The semiconductor device according to claim 1, further comprising:
   a conductive plug disposed on the high-doped semiconductor layer for electrically connecting to the high-doped semiconductor layer and the channel layer.

4. The semiconductor device according to claim 1, wherein a thickness of the high-doped semiconductor layer is larger than a thickness of the channel layer.

5. The semiconductor device according to claim 1, wherein the charge trapping structure comprises a plurality of first dielectric layers and second dielectric layers.

6. The semiconductor device according to claim 1, wherein the charge trapping structure and the channel layer are U-shaped.

7. The semiconductor device according to claim 1, wherein a material of the channel layer and a material of the high-doped semiconductor layer are the same.

8. The semiconductor device according to claim 1, wherein a material of each of the semiconductor layers is P type doping polysilicon, and a material of the high-doped semiconductor layer and the channel layer is N type doping polysilicon.

9. The semiconductor device according to claim 5, wherein heights of the first dielectric layers and heights of the second dielectric layers are different.

10. The semiconductor device according to claim 5, wherein a material of each of the first dielectric layers is silicon nitride, and a material of each of the second dielectric layers is silicon oxide.

11. A manufacturing method of a semiconductor device, comprising:
    forming a bottom insulating layer on a substrate;
    alternately stacking a plurality of semiconductor layers and insulating layers on the bottom insulating layer;
    forming a top insulating layer and a silicon nitride layer on the semiconductor layers and the insulating layers to form a plurality of stacked structures;
    sequentially depositing a charge trapping structure and a channel layer on surfaces of the stacked structures and a portion of a top surface of the bottom insulating layer;
    removing part of the channel layer to expose a top surface of the charge trapping structure;
    removing the charge trapping structure on the silicon nitride layer;
    removing the silicon nitride layer;
    depositing a high-doped semiconductor layer on each of the stacked structures, wherein the high-doped semiconductor layer is directly in contact with the channel layer; and
    etching to separate the high-doped semiconductor layer on each of the stacked structures;
    wherein a top of the high-doped semiconductor layer is higher than a top of the channel layer and a top of the charge trapping structure.

12. The manufacturing method of the semiconductor device according to claim 11, further comprising:
    forming a conductive plug on the high-doped semiconductor layer, wherein the conductive plug is electrically connected to the high-doped semiconductor layer and the channel layer.

13. The manufacturing method of the semiconductor device according to claim 11, wherein the silicon nitride layer is removed by phosphoric acid.

14. The manufacturing method of the semiconductor device according to claim 11, wherein the charge trapping structure comprises a plurality of first dielectric layers and second dielectric layers.

15. The manufacturing method of the semiconductor device according to claim 11, further comprising:
    forming a plurality of trenches to separate the stacked structures; and
    filling oxide in the trenches.

16. The manufacturing method of the semiconductor device according to claim 11, wherein the charge trapping structure and the channel layer are U-shaped.

17. The manufacturing method of the semiconductor device according to claim 11, wherein a material of the high-doped semiconductor layer and the channel layer is N type doping polysilicon.

18. The manufacturing method of the semiconductor device according to claim 14, wherein heights of the first dielectric layers and heights of the second dielectric layers are different.

* * * * *